United States Patent
Kröner

(10) Patent No.: US 6,573,145 B2
(45) Date of Patent: Jun. 3, 2003

(54) PROCESS FOR PRODUCING AN MOS FIELD EFFECT TRANSISTOR WITH A RECOMBINATION ZONE

(75) Inventor: Friedrich Kröner, Villach (AT)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/008,797

(22) Filed: Nov. 13, 2001

(65) Prior Publication Data
US 2002/0081785 A1 Jun. 27, 2002

(30) Foreign Application Priority Data
Nov. 10, 2000 (DE) .......................... 100 55 765

(51) Int. Cl.$^7$ ................................ H01L 21/336
(52) U.S. Cl. ................... 438/284; 438/157; 438/283
(58) Field of Search ......................... 438/157, 283, 438/284, 589

(56) References Cited

U.S. PATENT DOCUMENTS 5,120,666 A * 6/1992 Gotou ................... 438/164
5,578,513 A * 11/1996 Maegawa ............... 438/151
5,877,528 A * 3/1999 So ........................... 257/341
6,291,863 B1 * 9/2001 Chan ...................... 257/401

FOREIGN PATENT DOCUMENTS

DE  31 31 914 A1  2/1983
DE  199 49 364 A1  4/2000

* cited by examiner

Primary Examiner—Amir Zarabian
Assistant Examiner—Jamie L. Brophy
(74) Attorney, Agent, or Firm—Laurence A. Greenberg; Werner H. Stemer; Ralph E. Locher

(57) ABSTRACT

A process having a robust process sequence for producing an MOS field effect transistor having a horizontal buried gate formed of polysilicon and a recombination zone provided at the surface of the transistor includes the steps of producing the horizontal polysilicon gate first and then introducing the recombination zone. The process allows producing a transistor without encountering problems caused by the insufficient high-temperature compatibility of metals.

6 Claims, 2 Drawing Sheets

PROCESS FOR PRODUCING AN MOS FIELD EFFECT TRANSISTOR WITH A RECOMBINATION ZONE

BACKGROUND OF THE INVENTION

Field of the Invention

The invention relates to a process for producing an MOS (Metal Oxide Semiconductor) field effect transistor with a recombination zone, wherein the process is distinguished by a robust manufacturing sequence. The invention relates in particular to a process for producing an MOS field effect transistor having a horizontal buried gate formed of polysilicon and a recombination zone provided on a side of the surface of the MOS field effect transistor.

A conventional n-channel MOS power transistor has a parasitic bipolar transistor that includes the source region as an emitter, the channel or the so-called p-body region as the part of individual silicon islands forming the channel zone in the insulating layer as a base, and the substrate as a collector. In the case of such a transistor, if a more negative voltage is present on its drain connection than on the source connection, then the latter is not able to block the current flow since, in order to prevent a premature breakdown of the parasitic transistor in the structure, the source region and p-body region are short-circuited.

If, nevertheless, the pn junction between the source region and p-body region is to maintain its blocking capability, it is therefore necessary to prevent the premature breakdown of the parasitic bipolar transistor by other measures.

For this purpose, hitherto either an additional diode has been connected in series, which disadvantageously results in an additional undesired voltage drop in the circuit, or freewheeling diodes have been used and, in accordance with their dimensioning, an undesired controlled current flow through the power transistor had to be accepted.

More recent developments seek to introduce a recombination zone into the p-body region, through the use of which zone the base current of the parasitic bipolar transistor can be suppressed in such a way that no premature breakdown is triggered by the current. In this case, it was initially proposed to substantially maintain the geometry of the transistors involved and, additionally, to introduce a metal into the p-body region. Complicated, less tolerant process sequences with high requirements on the precision of the individual processes proved to be disadvantageous here, and also problems on account of interactions between the metal introduced and the silicon present.

SUMMARY OF THE INVENTION

It is accordingly an object of the invention to provide a process for producing an MOS field effect transistor which overcomes the above-mentioned disadvantages of the heretofore-known processes of this general type and which provides a MOS transistor having a recombination zone and which avoids problems attributable to interactions between metal and silicon.

With the foregoing and other objects in view there is provided, in accordance with the invention, a process for producing an MOS field effect transistor, which includes the steps of:

providing a base material including a buried oxide layer and a thin active silicon layer;

structuring the base material having the buried oxide layer and the active silicon layer for providing a structured region in the base material;

depositing silicon onto the structured region of the base material and outside the structured region of the base material by using an epitaxial deposition process;

contra-doping a channel region;

exposing partial regions of the buried oxide layer;

performing an etching process for removing any silicon oxide at least from the structured region of the base material;

forming a gate oxide and a horizontal buried gate formed of polysilicon;

structuring the polysilicon;

producing a source doping in a structured manner;

producing a dielectric in a structured manner;

providing a recombination zone at a surface region of the MOS field effect transistor by structuring a metal to be used for recombination; and producing gate and source contacts for the MOS field effect transistor.

According to the invention, a process is therefore proposed in which all the steps requiring a high temperature for the production of, for example, doped regions, gate oxides, insulation regions and gate regions formed of polysilicon are carried out first and only then is the metal serving for recombination brought into contact with the p-body region, which achieves a reversal of the configuration of the gate formed of polysilicon and the recombination zone and, as a result, disadvantageous interactions between the metal introduced and the silicon present are avoided.

The base material preferably used is a wafer-bonded SOI material.

Particular advantages result if the buried oxide layer is produced by implantation of oxygen.

If, in particular, such implantation of oxygen is carried out in a structured manner, the steps of structuring a base material with a buried oxide layer and a thin active silicon layer, and also the epitaxial deposition of silicon onto the structured base material and outside the same can be dispensed with, which results in an advantageous simplification and shortening of the process duration.

With the objects of the invention in view there is therefore also provided, a process for producing an MOS field effect transistor, the process includes the steps of:

providing a base material;

implanting oxygen into the base material in a structured manner for providing a buried oxide layer;

contra-doping a channel region;

exposing partial regions of the buried oxide layer;

performing an etching process for removing any silicon oxide;

forming a gate oxide and a horizontal buried gate formed of polysilicon;

structuring the polysilicon;

producing a source doping in a structured manner;

producing a dielectric in a structured manner;

providing a recombination zone at a surface region of the MOS field effect transistor by structuring a metal to be used for recombination; and producing gate and source contacts for the MOS field effect transistor.

The sequence of process steps specified in the above-defined processes does not necessarily have to be maintained in the order in which they are listed.

Other features which are considered as characteristic for the invention are set forth in the appended claims.

Although the invention is illustrated and described herein as embodied in a process for producing an MOS field effect transistor with a recombination zone, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Referring now to the figures of the drawings in detail and first, particularly, to FIGS. 1a to 1e thereof, there is shown in a simplified and successive manner, a process sequence for producing an MOS field effect transistor, as far as the formation of a polysilicon gate buried in a silicon substrate. In the following, an overall process sequence for producing an MOS field effect transistor according to a preferred first exemplary embodiment of the process is described.

Figure 1A:
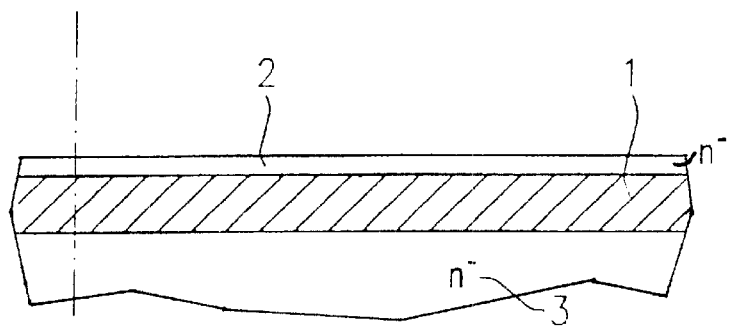
FIGS. 1a to 1e are simplified, partial sectional views of semiconductor structures illustrating successive steps in a process sequence for producing an MOS field effect transistor according to an exemplary embodiment of the process according to the invention, wherein the steps up to the formation of a polysilicon gate buried in a silicon substrate are illustrated.

In detail, according to FIG. 1a, the base material used is an n-material 3 corresponding to the voltage class of the MOS field effect transistor to be built up, having a buried oxide layer 1.

A suitable base material is, for example, a silicon-on-insulator or so-called SOI wafer, that is to say a composite structure composed of an active layer 2 of silicon which is deposited on an insulating material, here the n-material 3 having the buried oxide layer 1.

The layer of active silicon 2 above the buried oxide layer 1 must be very thin in this case, in order to coincide with the action to be achieved of a recombination zone in accordance with the small distance between metal and channel.

SOI wafers with a sufficiently thin active silicon layer can be produced, for example, both through the use of the so-called "SMART-CUT" process and also by implantation of oxygen, use preferably being made of the SMART-CUT process, since in this process, greater freedom in the choice of the buried oxide layer 1 is possible. Such base materials are available on the market.

Figure 1B:
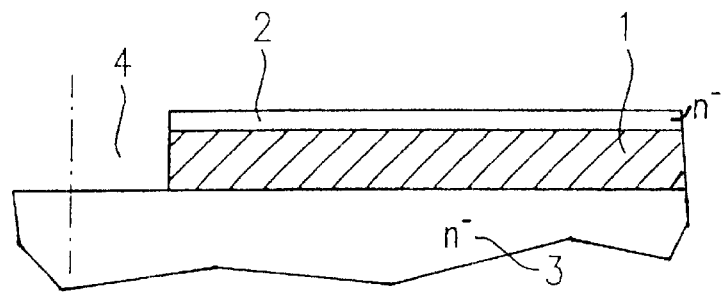

In a first step of a first process block in the overall process, according to FIG. 1b the thin layer 2 of active silicon and the buried oxide layer 1 are first structured in such a way that the n-material 3 is exposed close to the subsequent source region in a section 4.

Figure 1C:
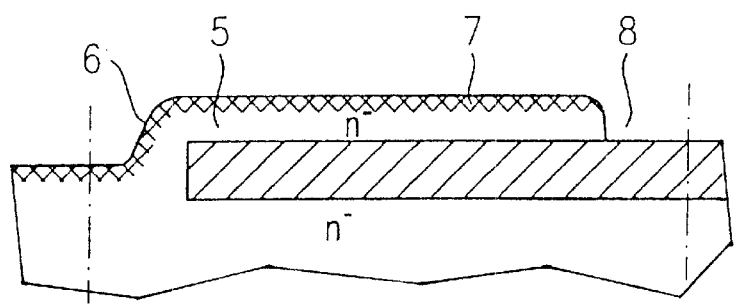

In a second step, according to FIG. 1c, an n-epitaxial layer 5 of silicon is then deposited, then a p-layer 7 is implanted without a mask, and etching channels 8 for the subsequent production of gate regions formed of polysilicon are subsequently defined conventionally by exposing or opening partial areas of the buried oxide layer 1. The geometric shape of the edge 6 of the epitaxial layer 5 can be influenced by appropriate choice of the process parameters.

Figure 1D:
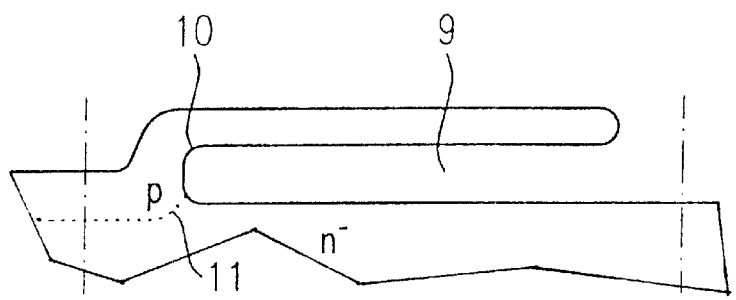

As FIG. 1d shows, in a third step, which is completely uncritical as such in relation to the overall process, the entire silicon oxide is etched through the use of a hydrofluoric acid solution (HF) and thereby removed in such a way that voids 9 are formed and, through the use of a sacrificial oxidation, the edges and corners 10 of the structure produced thus far are rounded. During this sacrificial oxidation, material diffuses out of the previously implanted p-layer 7 in the direction of the n-material 3 and, with the latter, forms the pn junction 11 between the subsequent channel and the drain region.

Figure 1E:
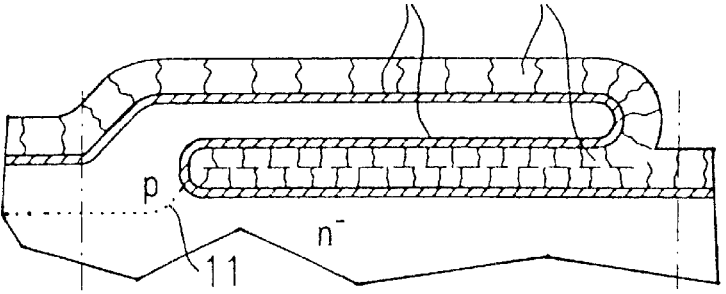

According to FIG. 1e, in a last step of this first process block, gate oxidation 12 and polysilicon deposition 13 are carried out, which complete the buried polysilicon gate regions.

A second process block of the overall process of the first exemplary embodiment will be described below with reference to FIGS. 2a and 2b.

Figure 2A:
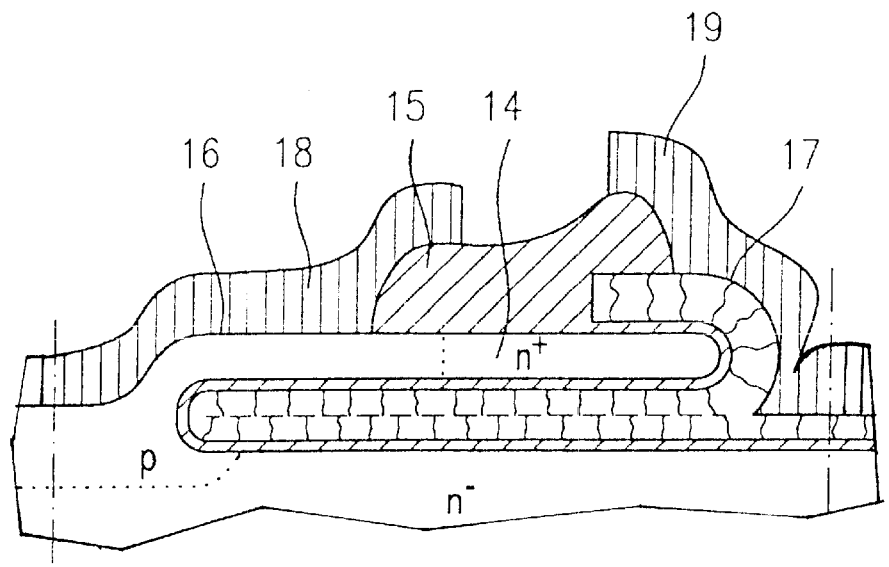
FIGS. 2a and 2b are simplified, partial sectional views of semiconductor structures illustrating the geometry of the source region, of the recombination zone and of the source terminal and also of the gate terminal in the structure produced in accordance with FIGS. 1a to 1e.

FIG. 2a shows, in a simplified, partial view, the geometry of the source region, of the recombination zone and of the source and the gate terminals in a structure produced by the first process block according to FIG. 1, the geometry being obtained by etching the deposited polysilicon 13, using a resist mask.

In a first step of the second process block, an $n^{30}$-material is firstly implanted and diffused in a structured manner to produce the subsequent source regions 14.

In a second step, an intermediate oxide 15 serving as dielectric is then deposited and removed at points at which metal yet to be applied is to be in contact with the silicon located underneath. The intermediate oxide 15 is opened in order to produce the recombination zones in a region 16 above the channel and to produce the polysilicon terminal in a region 17.

Then, in a third step, metal for a recombination zone 18 and a gate contact 19 is applied in a structured manner.

Figure 2B:
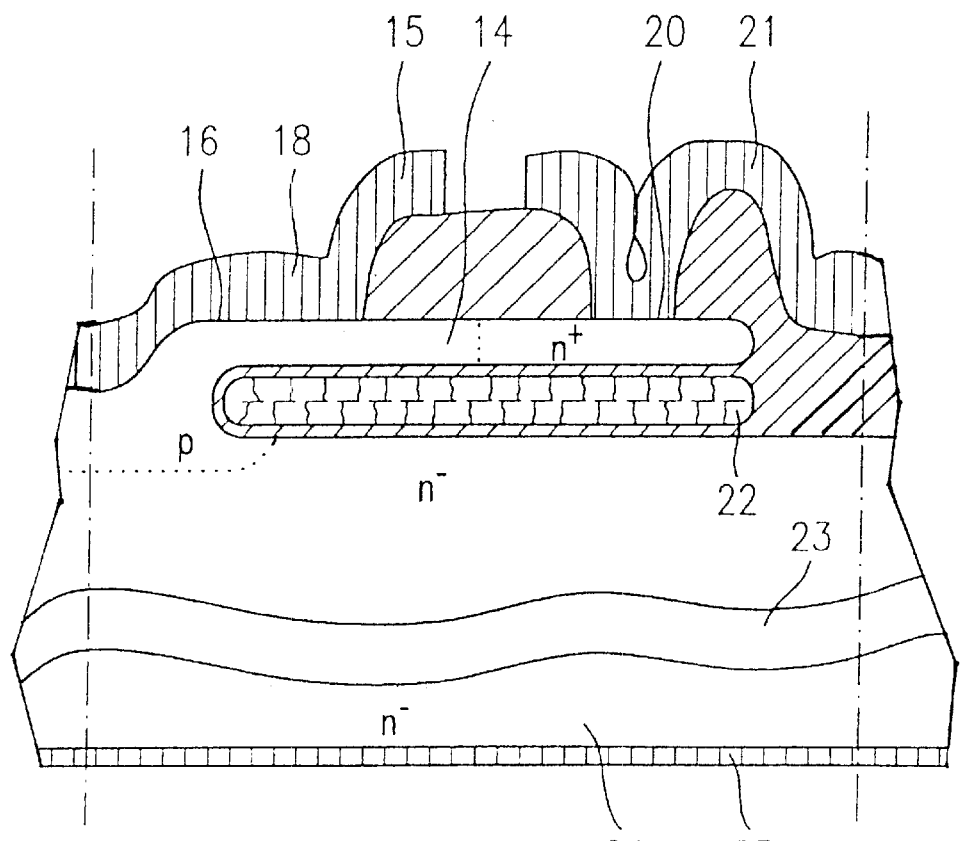

FIG. 2b shows, in a simplified, partial view, the geometry of the source region, of the recombination zone and of the source and gate terminals in a structure produced by the first process block according to FIGS. 1a and 1e, the geometry being obtained by etching the deposited polysilicon 13 without using a resist mask, in such a way that the etching process likewise removes the polysilicon 13 from the polysilicon region 17, which results in a surface course of the intermediate layer 15 which is different from the structure according to FIG. 1 in the surroundings of the gate contact.

In this case, metal for a source terminal 21 is applied in a structured manner via an opening 20 in the intermediate oxide 15 in a third step.

The polysilicon 22 remaining from the polysilicon 13 can readily be connected in the interior of the structure in this case, and gate resistors which may be necessary can then be adjusted through the use of an appropriate layout of the MOS field effect transistor.

Depending on the voltage class, in the structures described above, base material 23 remains on the rear side of the MOS field effect transistor to a thickness which is not illustrated to scale, as far as a drain region 24 having a conventional metalization 25 on the rear side of the wafer.

In an alternative embodiment, in the first step of the first process block, described above, implantation of oxygen can be carried out in a structured manner and, in this way, the steps of structuring a base material having a buried oxide layer and a thin active silicon layer, and also the epitaxial deposition of silicon onto the structured base material and outside the same can be dispensed with, which results in an advantageous simplification and shortening of the process duration.

As has been described above, all the steps requiring high temperature for the production of, for example, doping, gate oxides, insulation and gate regions formed of polysilicon are thus carried out first and only then is the metal serving for recombination brought into contact with the p-body region in such a way that the critical distance between the channel and the metal can be adjusted by easily controllable layer thicknesses from the epitaxial deposition of silicon, the ability of the pn junctions to block is ensured and can be controlled through the use of previously conventional surface processes and structuring processes, there is extensive freedom of choice with respect to the selection of the metal used for recombination, and robust individual processes with a cost-effective device of an earlier generation can be used.

The process sequence of the process described for producing an MOS field effect transistor with a recombination zone therefore includes the production of an MOS power transistor with a horizontal polysilicon gate in such a way that the horizontal polysilicon gate is produced first and only then is the recombination zone introduced, so that as a result of this, in the build-up direction of the transistor, the gate is "at the bottom", the channel region is "in the middle" and the recombination zone is "at the top."

This reversal of the configuration of the individual components of such a transistor makes it possible to produce a transistor with a recombination zone with robust individual processes of an earlier generation, for example at least the second oldest generation, without being affected by the problems caused by the low high-temperature compatibility of metals, that is to say without, for example, diffusion, spiking and formation of eutectica, and nevertheless to work with easily controllable horizontal structures.

I claim:

1. A process for producing an MOS field effect transistor, the process which comprises:
   providing a base material including a buried oxide layer and an active silicon layer;
   structuring the base material having the buried oxide layer and the active silicon layer for providing a structured region in the base material;
   depositing silicon onto the structured region of the base material and outside the structured region of the base material by using an epitaxial deposition process;
   contra-doping a channel region;
   exposing partial regions of the buried oxide layer;
   performing an etching process for removing any silicon oxide at least from the structured region of the base material;
   forming a gate oxide and a horizontal buried gate formed of polysilicon;
   structuring the polysilicon;
   producing a source doping in a structured manner;
   producing a dielectric in a structured manner;
   providing a recombination zone at a surface region of the MOS field effect transistor by structuring a metal to be used for recombination; and
   producing gate and source contacts for the MOS field effect transistor.

2. The process according to claim 1, which comprises using a wafer-bonded SOI material as the base material.

3. The process according to claim 1, which comprises producing the buried oxide layer by implanting oxygen.

4. The process according to claim 1, which comprises producing the buried oxide layer by implanting oxygen in a structured manner.

5. The process according to claim 1, which comprises providing the active silicon layer such that the active silicon layer is thinner than the buried oxide layer.

6. A process for producing an MOS field effect transistor, the process which comprises:
   providing a base material;
   implanting oxygen into the base material in a structured manner for providing a buried oxide layer;
   contra-doping a channel region;
   exposing partial regions of the buried oxide layer;
   performing an etching process for removing any silicon oxide;
   forming a gate oxide and a horizontal buried gate formed of polysilicon;
   structuring the polysilicon;
   producing a source doping in a structured manner;
   producing a dielectric in a structured manner;
   providing a recombination zone at a surface region of the MOS field effect transistor by structuring a metal to be used for recombination; and
   producing gate and source contacts for the MOS field effect transistor.

* * * * *